United States Patent
Kahmen et al.

(10) Patent No.: US 10,425,216 B2
(45) Date of Patent: Sep. 24, 2019

(54) OPTOELECTRONIC CIRCUIT AND A METHOD FOR THE TRANSMISSION OF AN OPTICAL CLOCK SIGNAL

(71) Applicant: Rohde & Schwarz GmbH & Co. KG, Munich (DE)

(72) Inventors: Gerhard Kahmen, Oberhaching (DE); Ingo Dettmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 216 days.

(21) Appl. No.: 14/318,004

(22) Filed: Jun. 27, 2014

(65) Prior Publication Data
US 2015/0003833 A1    Jan. 1, 2015

(30) Foreign Application Priority Data
Jun. 28, 2013 (DE) .......................... 10 2013 212 702

(51) Int. Cl.
| | |
|---|---|
| *H04L 7/00* | (2006.01) |
| *H03M 1/10* | (2006.01) |
| *G06F 1/10* | (2006.01) |
| *H03M 1/12* | (2006.01) |

(52) U.S. Cl.
CPC ............ *H04L 7/0075* (2013.01); *G06F 1/105* (2013.01); *H03M 1/1066* (2013.01); *H03M 1/1215* (2013.01)

(58) Field of Classification Search
None
See application file for complete search history.

(56) References Cited

U.S. PATENT DOCUMENTS

| | | | |
|---|---|---|---|
| 4,959,540 A * | 9/1990 | Fan ...................... | G02B 6/2861 250/227.12 |
| 6,215,941 B1 * | 4/2001 | Nagai .................. | G02B 6/2861 250/227.12 |
| 7,956,788 B2 | 6/2011 | Lee et al. | |
| 2001/0020908 A1 | 9/2001 | Prucnal | |
| 2002/0131675 A1 | 9/2002 | Litvin | |
| 2003/0016423 A1 * | 1/2003 | Cho ................... | H04B 10/6932 398/202 |
| 2005/0013537 A1 | 1/2005 | Yamazaki | |
| 2010/0277354 A1 * | 11/2010 | Lee ...................... | H03M 1/1215 341/137 |
| 2011/0057091 A1 | 3/2011 | Hochberg et al. | |
| 2011/0150477 A1 * | 6/2011 | Winzer ............... | H04B 10/6971 398/65 |

FOREIGN PATENT DOCUMENTS

EP          2660821 A1 *   6/2013

* cited by examiner

*Primary Examiner* — Casey L Kretzer
(74) *Attorney, Agent, or Firm* — Ditthavong & Steiner, P.C.

(57) ABSTRACT

An optoelectronic circuit for transmitting an optical clock signal to an electronic component contains a clock-generating device for the generation of an optical clock signal, a converter element for the conversion of the optical clock signal into an electrical clock signal supplied to the electronic component and an optical line from the clock-generating device to the conversion element. The optoelectronic circuit in this context provides a delay time of the optical clock signal from the clock-generating device to the conversion element. The optoelectronic circuit accordingly comprises an adjustable optical element for adjusting the delay time between the clock-generating device and the electronic component.

11 Claims, 4 Drawing Sheets

OPTOELECTRONIC CIRCUIT AND A METHOD FOR THE TRANSMISSION OF AN OPTICAL CLOCK SIGNAL

FIELD OF THE INVENTION

The invention relates to an optoelectronic circuit and a method which allow a fine-tuning of signal delay times in an optical path.

BACKGROUND OF THE INVENTION

Optical and optoelectronic systems generally provide complex waveguide structures which are used for the transport of an optical signal. In numerous applications, a signal delay time controllable to an accuracy of a few fs is required in order to achieve a required performance of the overall system. For example, U.S. Pat. No. 7,956,788 B2 discloses an optoelectronic analog-digital converter in which individual sample-and-hold elements are controlled with an optical clock signal.

Scattering of the sampling times occurs within the optical network and also in the electronic components in a manner dependent upon manufacture. These scatterings are caused, for example, by tolerances in the geometric manufacture of the waveguides, tolerances in the refractive indices of the waveguides, but also through tolerances in the electronic components. Added to this, thermal gradients in the circuit lead to position-dependent fluctuations in the delay times of the optical and electronic components.

One value relevant for the performance of the overall system is the time precision with which the analog signal is sampled. In particular, with the use of N time-nested samplers, which together provide a sampler with N-fold sampling rate, an exact sampling is necessary at the time $t_0+(M/N)*t\_clock$. In this context, M denotes the number of the individual samplers in the system. If it is not possible to guarantee a time-exact sampling between the samplers, undesirable secondary lines occur in the signal reconstructed from the individual samplers.

This leads to the need of providing an optoelectronic circuit and a method for operating an optoelectronic circuit which allow a very precise observation of the planned delay times of the signal.

SUMMARY OF THE INVENTION

An optoelectronic circuit according to the invention for transmitting an optical clock signal to an electronic component contains a clock-generating device for the generation of the optical clock signal, a converter element for the conversion of the optical clock signal into an electrical clock signal supplied to the electronic component and an optical line from the clock-generating device to the converter element. In this context, the optoelectronic circuit provides a delay time of the optical clock signal from the clock-generating device to the converter element. The optoelectronic circuit accordingly comprises an adjustable optical element for the adjustment of the delay time between the clock-generating device and the electronic component. Accordingly, inaccuracies in the delay times caused by component tolerances, thermal stresses etc. can be compensated.

The optical line is advantageously the adjustable optical element. The delay time can then be adjusted by varying an optical length of the optical line. The optical line then provides at least one heating element for heating the optical line. The optical length of the optical line can be adjusted in order to adjust the delay time by heating of the optical line. In this manner, the delay time can be adjusted very simply without further components connected in the optical path. By varying the temperature, the refractive index can also be adjusted. The delay time can also be influenced as a result.

As an alternative, the optoelectronic circuit provides a Kerr cell or a Pockels cell connected in series to the optical line as an adjustable optical element. The delay time can then be adjusted by adjusting the optical length of the Kerr cell or the Pockels cell. In this manner, the delay time can be adjusted particularly accurately. Furthermore, the use of heating elements, which also provide a high power consumption, can be avoided in this manner.

By preference, the clock-generating device is a pulsed light source pulsed with the clock frequency, especially a pulsed laser or a pulsed laser diode or a pulsed diode. The converter element is preferably a photodiode or a phototransistor. An optoelectronic device according to the invention comprises at least two optoelectronic circuits described above, a control device for controlling the delay times of the optoelectronic circuit and at least two electronic components. Different times for the arrival of the clock signals in the two electronic components can be realised in this manner.

By preference, the optoelectronic device is a sampling circuit. The optoelectronic device then comprises sample-and-hold elements as the electronic components to which the optoelectronic circuits transmit the clock signal. In this context, the delay times of the optoelectronic circuits are dimensioned in such a manner that, within one sampling period, different sampling times of the sample-and-hold elements are obtained. The regulating device is accordingly embodied to fine-tune the sampling times by adjusting the delay times of the optoelectronic circuits. Accordingly, a particularly high precision of the sampling times can be achieved.

Alternatively, the optoelectronic device is a multiplexer circuit. The optoelectronic device then comprises switching elements as the electronic components to which the optoelectronic circuits transmit the clock signal. The delay times of the optoelectronic circuits are then dimensioned in such a manner that different switching times of the switching elements are obtained with whole-number divisors of each clock period. The regulating device is then embodied to fine-tune the switching times by adjusting the delay times of the optoelectronic circuits. In this manner, a particularly accurate adjustment of the switching times of the individual switching elements can be achieved.

By preference, the regulating device is embodied to compensate a temperature gradient within the optoelectronic device by means of the adjustable optical elements. Accordingly, temperature gradients caused by other components which influence the delay times can be compensated.

The optoelectronic device further advantageously comprises a calibration device for the feeding of a calibration signal. The optoelectronic device is then embodied to determine calibration values within the context of a calibration measurement on the basis of the calibration signal fed in, and to adjust the adjustable optical elements on the basis of the calibration values. In this manner, a particularly high precision of the fine-tuning of the delay times can be achieved.

A method according to the invention serves for the transmission of an optical clock signal to an electronic component. Initially, an optical clock signal is generated. This is converted into an electrical signal before supply to the electronic component. The optical clock signal is accordingly guided via an optical line to the electronic component. In this context, the optical clock signal provides a delay time from the clock generation to the electronic component. This delay time can be adjusted. Accordingly, inaccuracies in the delay time based on component tolerances, thermal stresses etc. can be compensated.

BRIEF DESCRIPTION OF THE DRAWINGS

In the following, the invention is described by way of example on the basis of the drawings in which an advantageous exemplary embodiment of the invention is presented. The drawings show.

DETAILED DESCRIPTION OF EMBODIMENTS

Initially, with reference to FIG. 1, the problem underlying the present invention will be described in detail. Following this, with reference to FIG. 1-FIG. 4, the construction and functioning of various exemplary embodiments of the optoelectronic circuit according to the invention will be explained. Finally, with reference to FIG. 5, the functioning of an exemplary embodiment of the method according to the invention will be described. In some cases, the presentation and description of identical elements in similar drawings has not been repeated.

Figure 1:
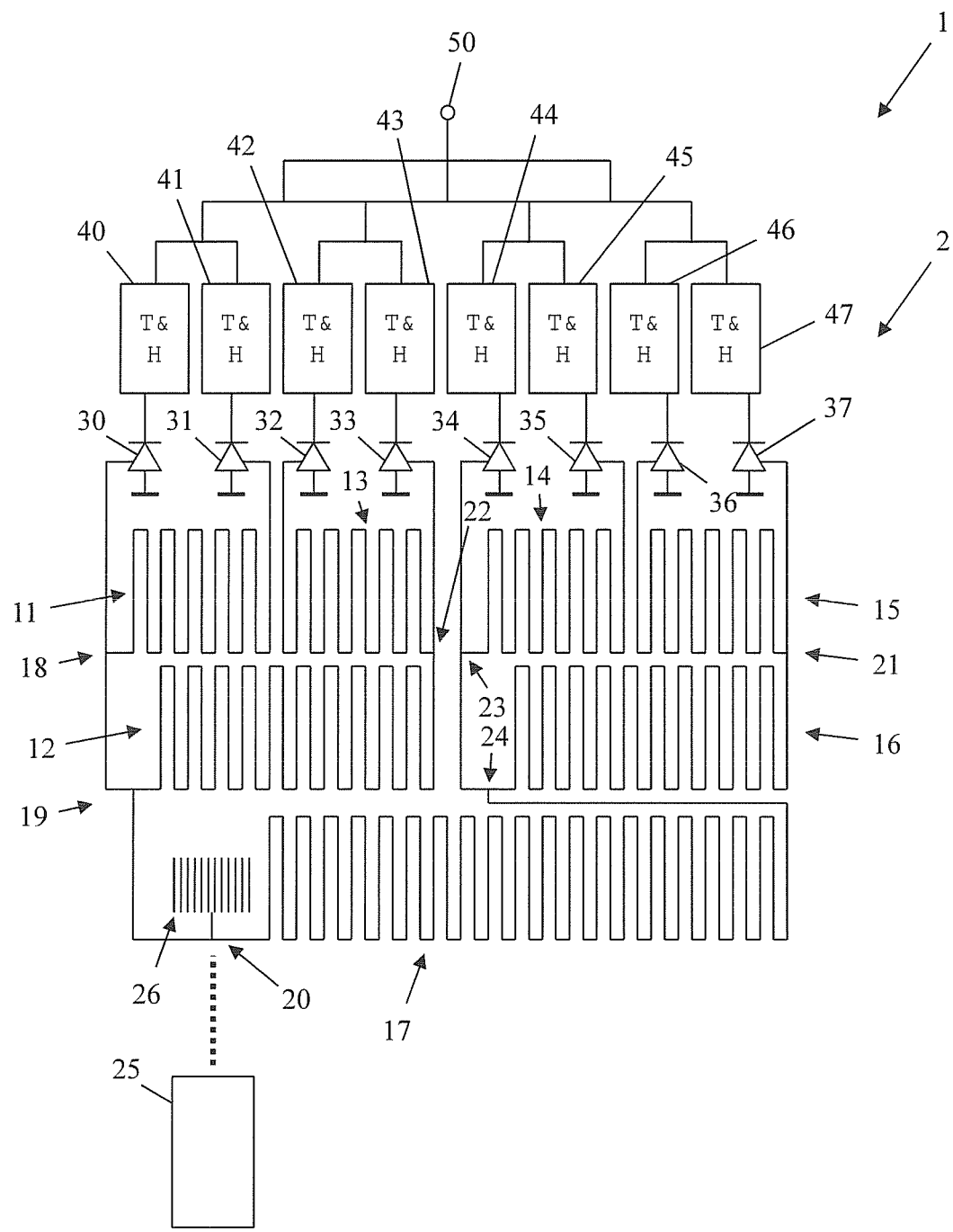
FIG. 1 a first exemplary embodiment of the optoelectronic circuit according to the invention in an exemplary optoelectronic device.

FIG. 1 illustrates an optoelectronic device 1. The optoelectronic device 1 illustrated here is a sampling circuit, such as are used, for example, in an analog-digital converter. Accordingly, the optoelectronic device 1 contains a signal connection 50 by means of which a signal to be sampled can be fed in. A plurality of sample-and-hold elements 40-47 to which the signal to be sampled is supplied in each case are connected to the signal connection 50. Furthermore, the optoelectronic device 1 contains a plurality of optoelectronic circuits 2, which one each contain a converter element 30-37. In this context, the converter elements 30-37 are embodied as photodiodes. These are each connected to one of the sample-and-hold elements 40-47 of the optoelectronic device 1 and embodied to trigger the sampling by the sample-and-hold elements as soon as an optical signal reaches the respective converter element 30-37.

Each of the optoelectronic circuits 2 further comprises an optical line by means of which it is connected to a clock-generating device 25, which is formed here by a laser. The length of the respective optical paths resulting in this context differs.

Accordingly, a different delay time of the signals from the clock-generating device 25 to the individual converter elements 30-37 is achieved. In this context, the delay time between the clock-generating device 25 and the sample-and-hold elements 40-47 is adjusted in such a manner that an equal distribution of the sampling times of the sample-and-hold elements 40-47 during one clock period of the clock specified by the clock-generating device 25 is obtained.

Accordingly, in this example, it is possible to sample with a sampling rate 8 times higher by comparison with the clock rate.

In this context, each of the optoelectronic circuits 2 comprises its own converter element 30-37 and an optical line from the clock-generating device 25 to the converter element 30-37. Furthermore, the optoelectronic circuits 2 share the common clock-generating device 25. The clock-generating device 25 here is accordingly a part of all of the optoelectronic circuits 2.

In order to feed the optical clock signal into the optical lines, the system illustrated here further comprises a grating coupler 26, which is adjusted to the wavelength of the clock-generating device 25 and, in this manner, takes over as large a power as possible into the optical lines. The optical clock signal fed in is divided by the grating coupler 26 via a signal splitter 20 into a left path and a right path. The left path is once again divided via a signal splitter 19. The left path of the signal splitter 19 is supplied to a further signal splitter 18. The left path of the signal splitter 18 is used directly for the control of the converter element 30. The right path of the signal splitter 18 is connected to a delay element 11 which comprises a length specified by a meandering optical line. In this context, the delay element delays the clock signal and routes it to the converter element 31.

The right path of the signal splitter 19 is connected via a further delay element 12 to a further signal splitter 22. The right path of the signal splitter 22 directly controls the converter element 33, while the left path of the signal splitter 22 controls the converter element 32 via a further delay element 13. The right path of the signal splitter 20 leads initially via a further delay element 17 and then to a further signal splitter 24. The left path of the latter leads to a further signal splitter 23, of which the left path is used directly for the control of the converter element 34. The right path of the signal splitter 23 leads via a further delay element 14 to the converter element 35. The right path of the signal splitter 24 leads via a further delay element 16 to a further signal splitter 21. The right path of the latter directly controls the converter element 37, while its left path controls the converter element 36 via a further delay element 15.

With regard to the delay times of the optical signals, errors occur within the range of typically 1-100 fs. An even more accurate calibration is not possible without compensating signs of ageing, component tolerances and temperature changes. That is, the error named above is compensated by matching of the optical lengths.

In the exemplary embodiment illustrated here, no separate, adjustable optical elements are shown for adjusting the delay time between the clock-generating device 25 and the respective converter element 30-37. Here, the delay times can be adjusted directly by the delay elements 11-17. That is, the delay elements 11-17 correspond to adjustable optical elements for the adjustment of the delay time. FIG. 1 does not illustrate the mechanism for adjusting the delay time of the delay elements 11-17. This will be described in greater detail with reference to FIG. 2 and FIG. 3.

As already explained, inaccuracies regarding the delay times of the signals from the clock-generating device to the electronic components which should be controlled at exactly determined times results from various reasons. Accordingly, on the one hand, inaccuracies of the optical lengths of the optical paths can exist between the clock-signal generation and the converter elements 30-37. On the other hand, inaccuracies of the electrical lengths between the converter elements 30-37 and the electronic components 40-47 can exist. In order to compensate these inaccuracies, the signal delay time can be fine-tuned by matching the optical lengths of the optical paths from the clock-generating device 25 to the individual converter elements 30-37. That is, not only the optical inaccuracies can be compensated, but also the electronic inaccuracies.

With regard to the speed of light in waveguides, $C_{Medium}=c_0/n(T)$ applies. In this context, $c_0$ denotes the speed of light in free space, n(T) is the temperature-dependent refractive index of the waveguide. Accordingly, the speed of light within the waveguide can be matched by varying the temperature. In this manner, the delay time within the waveguide can be varied by matching the temperature.

Figure 2:
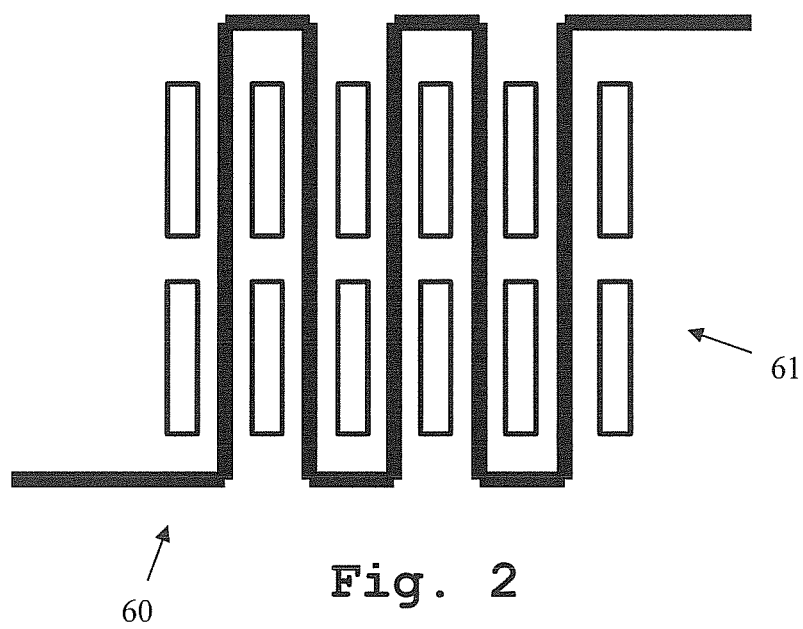
FIG. 2 a detail of a second exemplary embodiment of the optoelectronic circuit according to the invention.

In FIG. 2, a detail of a second exemplary embodiment of the optoelectronic circuit according to the invention is illustrated. FIG. 2 shows a waveguide 60 and a plurality of heating elements 61. In this context, the heating elements 61 are arranged in the surroundings of the waveguide 60 and embodied in order to heat the waveguide 60. The individual heating elements 61 can therefore be controlled individually in order to achieve a temperature gradient. This is particularly useful, for example, if a temperature gradient is present in the remainder of the circuit, for example, as a result of strongly heating components. In this case, a counter gradient can be generated by the heating elements 61 in order to achieve the most homogenous temperature distribution and accordingly the most balanced delay time possible. This will be described in greater detail with reference to FIG. 3. By matching the temperature of the heating elements 61, the temperature of the waveguide 60 can be varied. As a result, the optical length of the waveguide 60 is changed. Alternatively, a desired gradient can be generated in a targeted manner in order to achieve a desired delay-time profile.

Figure 3:
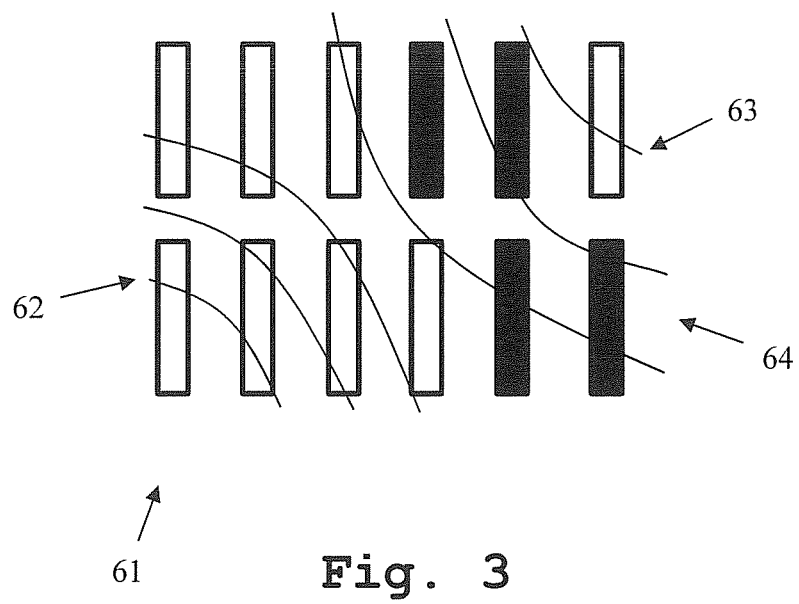
FIG. 3 a detail of a third exemplary embodiment of the optoelectronic circuit according to the invention in operation.

FIG. 3 shows a detail of a third exemplary embodiment of the optoelectronic circuit according to the invention during operation. The presentation of the waveguide 60 from FIG. 2 has been omitted here. The plurality of heating elements 61 and a temperature gradient 62 which is generated by other components present in the circuit are illustrated here. By controlling some of the heating elements 61, more precisely, by controlling the heating elements 64, it is possible to generate a counter gradient 63 which allows a largely homogenous temperature distribution.

Instead of using heating elements which can be arranged around the waveguide, a separate adjustable optical element can alternatively also be connected in series to the optical line —the waveguide—in every optical path to one of the converter elements 30-37 from FIG. 1. For example, Kerr cells or Pockels cells can be used for this purpose. These allow a matching of the optical length by applying an electrical signal. Other components which can be stimulated in order to vary their optical length can also be used here.

Figure 4:
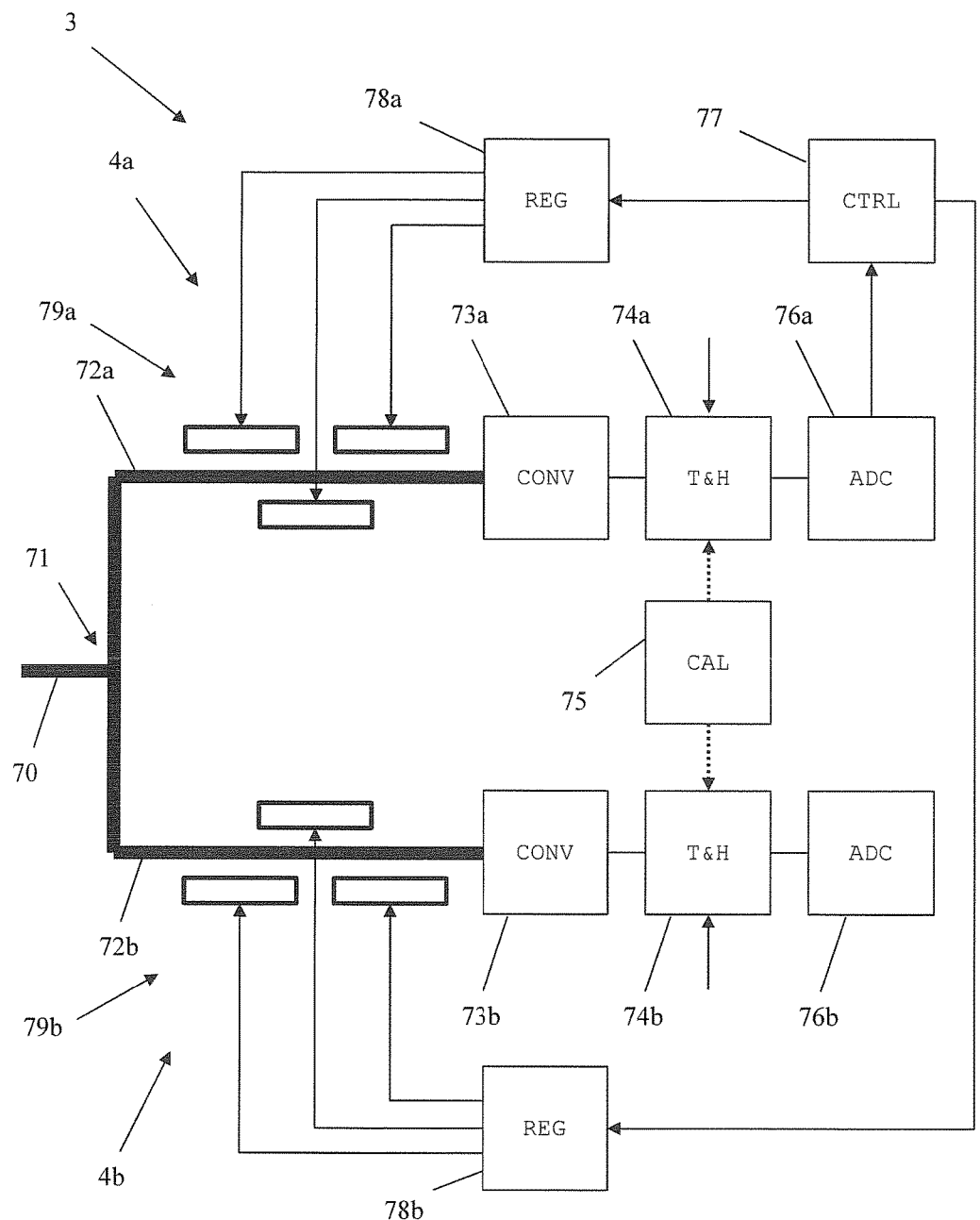
FIG. 4 a fourth exemplary embodiment of the optoelectronic circuit according to the invention.

FIG. 4 shows a fourth exemplary embodiment of the optoelectronic circuit in an optoelectronic device 3. Particular reference will be made here to the controlling of the adjustable optical elements, here, waveguides capable of being heated via heating elements.

The optoelectronic device 3 contains two optoelectronic circuits 4a, 4b, and connected to the latter, in each case, a sample-and-hold element 74a or respectively 74b, and connected to these, in each case, an analog-digital converter 76a, 76b. Furthermore, the optoelectronic device 3 contains a control device 77 and regulating devices 78a and 78b. A description of a clock-generating device contained by the optoelectronic device has not been provided here.

An optical line 70 is used for feeding an optical clock signal. Via a signal splitter 71, the optical clock signal is subdivided to a first optoelectronic circuit 4a and a second optoelectronic circuit 4b. In this context, the optoelectronic circuits 4a, 4b contain an optical line 72a respectively 72b, and, arranged around the latter, heating elements 79a respectively 79b.

The optical clock signal is transmitted from the signal splitter 71 to the two optical lines 72a respectively 72b and from these, optically to the converter elements 73a and respectively 73b. The converter elements 73a and respectively 73b convert the optical signals into electrical signals. The converter elements 73a and respectively 73b are, for example, photodiodes or phototransistors. The resulting electrical clock signal is transmitted in each case to the sample-and-hold elements 74a respectively 74b. The signal to be sampled is further supplied to the sample-and-hold elements. Resulting sampled values of the sample-and-hold elements 74a respectively 74b are supplied to the analog-digital converters 76a and respectively 76b. Signal outputs of the analog-digital converters 76a, 76b have not been illustrated here for the sake of visual clarity.

If the optoelectronic device 3 is charged with an unknown signal to be sampled, it is not possible to determine whether the delay times of the signals through the optoelectronic circuits 79a, 79b are correct. In order to achieve this, a calibration is implemented. To implement a calibration, the optoelectronic device 3 contains a calibration device 75, which is connected to the sample-and-hold elements 74a respectively 74b. In this context, the calibration device 75 generates a calibration signal, for example, a high-precision known sinusoidal signal which is transmitted instead of the payload signal to the sample-and-hold elements 74a, 74b. As described above, the optical clock signal is transmitted through the optical lines 72a, 72b to the converter elements 73a, 73b and converted by the latter into an electrical clock signal. In this manner, a measurement of the calibration signal of the calibration device 75 is implemented by means of a sampling by the sample-and-hold elements and by means of the analog-digital converters 76a, 76b.

The resulting signal is transmitted to the control device 77 connected to the analog-digital converter and evaluated by the latter. It is compared with the ideal calibration signal which was generated by the calibration device 75. For reasons of visual clarity, a description of the connection between the calibration device 75 and the control device 77 has not been provided here. The control device 77 accordingly determines, on the basis of the ideal calibration signal and the measured calibration signal, whether the delay times have been correctly adjusted. If this is not the case, the control device 77 transmits to the regulating devices 78a respectively 78b connected to it a signal which triggers a corresponding adjustment of the heating devices 79a respectively 79b.

Such a calibration measurement is then repeated until the desired delay times on the individual optical paths are adjusted. As soon as the calibration is complete, the measurement of the payload signal can be resumed. Such a calibration procedure can be implemented automatically upon activation of the device. Alternatively, the user of the device can also initiate such a calibration procedure.

The calibration procedure is, of course, also compatible with the adjustment of the delay times by means of Kerr cells or Pockels cells described above. In this case, the regulating devices 78a and respectively 78b control the Kerr cells respectively Pockels cells. The exemplary embodiment shown in FIG. 4 can, of course, also be expanded in an analogous manner for a larger number of optical paths.

Alongside active regulation with a measurement of a calibration signal, different operating conditions can be additionally measured within the context of a factory calibration. Resulting settings, for example, of the heating elements or Kerr cells or Pockels cells are then stored in a look-up table and, in a practical case, called up for the respective operating condition.

As a further alternative, a direct measurement of the temperature is possible at different positions of the circuit. These measured temperatures can then be compensated through targeted heating of the heating elements or through an adjustment of the Pockels cells or the Kerr cells. That is, a real-time measurement of the temperature is implemented in the circuit.

FIG. 4 shows an individual control of the heating elements 79a, 79b by the regulating devices 78a, 78b. Alternatively, a combination of at least two individual heating elements is also possible in order to form jointly controlled groups. With this measure, the cost of the circuit can be reduced.

Cooling elements can also be used instead of heating elements in order to modify the optical length. Instead of operating with discrete heating elements which are distributed in the circuit, it is possible, for example, as an alternative, to introduce heat at a given positions of the circuit in a contactless manner, for example, by means of infrared radiation. In the above exemplary embodiments, the terms optical line and waveguide have been used synonymously.

Figure 5:
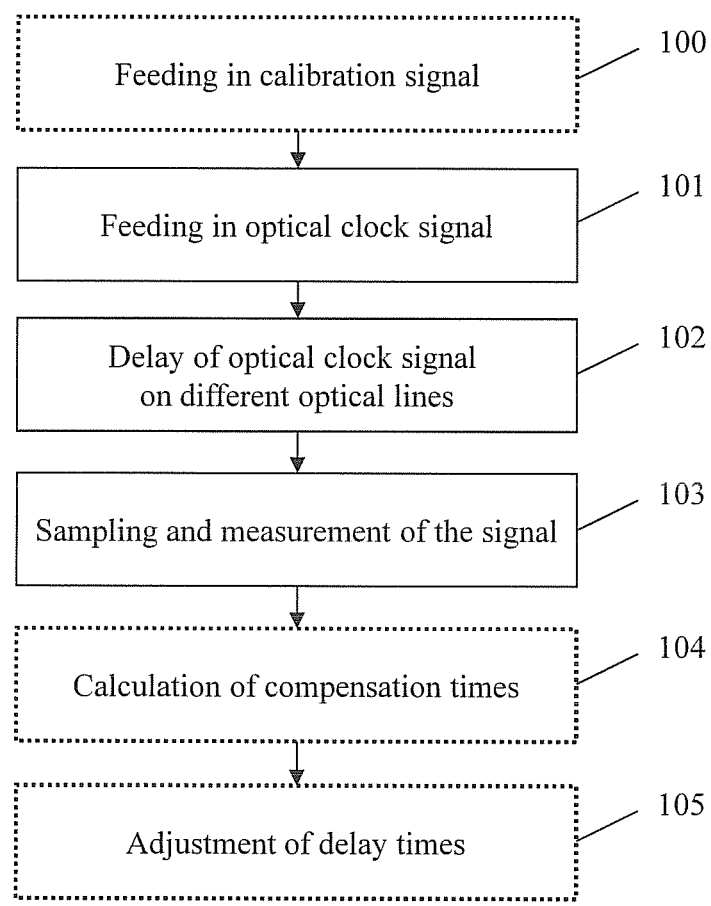
FIG. 5 an exemplary embodiment of the method according to the invention.

Finally, with reference to FIG. 5, the functioning of an exemplary embodiment of the method according to the invention will be described. In an optional first step 100, a calibration signal, that is, a high-precision and known signal, is fed in instead of a payload signal. In a second step 101, an optical clock signal is fed in. In a third step 102, the optical clock signal is delayed on different optical lines in order to achieve desired delay times of the optical clock signal in this manner. In a fourth step 103, a sampling and measurement of the signal triggered by the optical clock signal takes place. If the optional step 100 was implemented, the calibration signal is measured in step 103. Otherwise a payload signal is measured.

In a further optional step 104, on the basis of the known calibration signal and the measured calibration signal, compensation times are calculated, which are necessary in order to calculate the desired delay times. In an optional sixth step 105, the delay times are adjusted on the basis of the calculated compensation times. This adjustment of the delay times is implemented, for example, by adjusting heating elements, which vary the optical length of the optical lines. Alternatively, the Kerr cells or Pockels cells explained with reference to the device can also be used.

The steps 100, 104 and 105 are optional in this context and should be implemented together. That is, either only the steps 101 to 103 should be implemented for the measurement of a payload signal, or the steps 100 to 105 should be implemented in order to implement a calibration.

The invention is not restricted to the exemplary embodiment presented. As already mentioned, different circuit functions, such as a sampling circuit or a multiplexer circuit can be used. All circuits which provide an optical clock tree can be used according to the invention by optimising the delay times. All of the features described above or shown in the drawings can be advantageously combined with one another arbitrarily within the scope of the invention.

While the foregoing description has touched upon various preferred embodiments and applications of the instant invention, those skilled in the art, having read the foregoing, will immediately recognize that the concepts detailed therein can be implemented and/or used in numerous obvious alternative structures and applications. Accordingly, it is understood that the scope of applicants' invention shall not be limited to those preferred and/or exemplary embodiments described herein, but instead, shall be defined exclusively by the finally-issued claims (which claims are intended to be read in the broadest reasonable manner), and any and all equivalents thereto.

What is claimed is:
1. An optoelectronic device comprising:
at least two optoelectronic circuits;
at least two electronic components;
a regulating device for controlling delay times of the at least two optoelectronic circuits;
a clock-generating device for generating optical clock signals;
a converter element for converting the optical clock signals into electrical clock signals supplied to the at least two electronic components; and
an optical line from the clock-generating device to the converter element,
wherein the at least two optoelectronic circuits provide adjustable optical elements for adjusting a delay time between the clock-generating device and the at least two electronic components,
wherein the regulating device controls a compensation of a temperature gradient within the at least two optoelectronic devices by the adjustable optical elements,
wherein the optoelectronic device is a sampling circuit, wherein the optoelectronic device comprises sample-and-hold elements as the at least two electronic components, to which the at least two optoelectronic circuits transmit the electrical clock signals,
wherein the delay times of the at least two optoelectronic circuits are set in such a manner that different sampling times of the sample-and-hold elements are achieved with whole-number divisors of a clock period, and
wherein the regulating device controls a fine-tuning of the sampling times by adjusting the delay times of the at least two optoelectronic circuits.
2. The optoelectronic device according to claim 1,
wherein the optical line includes the adjustable optical elements,
wherein the delay time is adjustable by varying an optical length of the optical line,
wherein the optical line provides at least one heating element for heating the optical line, and
wherein the optical length of the optical line for adjusting the delay time is adjustable by heating the optical line.
3. The optoelectronic device according to claim 1,
wherein the at least two optoelectronic circuits provide, connected in series to the optical line, a Kerr cell or a Pockels cell as the adjustable optical elements, and
wherein the delay time is adjustable by adjusting the optical length of the Kerr cell or the Pockels cell by applying an electrical signal to the Kerr cell or the Pockels cell.
4. The optoelectronic device according to claim 1,
wherein the clock-generating device is a light source pulsed with a clock frequency, a pulsed laser, a pulsed laser diode or a pulsed diode, and/or
wherein the converter element is a photodiode or a phototransistor.

5. The optoelectronic device according to claim 1, wherein the optoelectronic device is a multiplexer circuit, wherein the optoelectronic device comprises switching elements as the at least two electronic components to which the at least two optoelectronic circuits transmit the electrical clock signals, wherein the delay times of the at least two optoelectronic circuits are dimensioned in such a manner that different switching times of the switching elements are obtained with whole-number divisors of every clock period, and wherein the regulating device is embodied to fine-tune the switching times by adjusting the delay times of the at least two optoelectronic circuits.

6. The optoelectronic device according to claim 1, wherein the optoelectronic device comprises a calibration device for feeding of a calibration signal to the at least two electronic components, wherein the optoelectronic device is configured to determine calibration values on the basis of a calibration measurement and, on the basis of the calibration values, to adjust the adjustable optical elements.

7. A method for transmitting an optical clock signal to an electronic component, comprising the following steps:

generating the optical clock signal, converting the optical clock signal into an electrical clock signal supplied to the electronic component, and supplying the optical clock signal via an optical line for conversion into the electrical clock signal, wherein the optical clock signal is provided with a delay time from the optical clock signal generation to the electronic component, wherein the delay time is adjusted, wherein the delay time is regulated, wherein a temperature gradient within the electronic component is compensated, wherein the method serves for transmission of a clock signal in a sampling circuit of the electronic component, wherein the electronic component, to which the optical clock signal is transmitted, comprises sample-and-hold elements, and wherein sampling times of the sample-and-hold elements are obtained with whole-number divisors of every clock period.

8. The method according to claim 7, wherein the delay time is adjusted by varying an optical length of the optical line, wherein the optical length of the optical line is adjusted for the adjustment of the delay time by heating the optical line.

9. The method according to claim 7, wherein the delay time is adjusted by adjusting the optical length of a Kerr cell or a Pockels cell, which is connected in series to an optical line, by applying an electrical signal to the Kerr cell or Pockels cell.

10. The method according to claim 7, wherein the method serves for the transmission of a clock signal in a multiplexer circuit, wherein the electronic components to which the clock signal is transmitted are switching elements, and wherein the delay times are dimensioned in such a manner that different switching times of the switching elements are obtained with whole-number divisors of every clock period, and that the switching times are fine-tuned by adjusting the delay times.

11. A method for transmitting an optical clock signal to an electronic component, comprising the following steps:

generating the optical clock signal, converting the optical clock signal into an electrical clock signal supplied to the electronic component, and supplying the optical clock signal via an optical line for conversion into the electrical clock signal, wherein the optical clock signal is provided with a delay time from the optical clock signal generation to the electronic component, wherein the delay time is adjusted, wherein the delay time is regulated, wherein a temperature gradient within the electronic component is compensated, wherein a calibration signal is fed from a calibration device to the electronic component for determining calibration values, and wherein calibration values are determined based on a calibration signal of a calibration measurement, and the delay time is adjusted on the basis of the calibration values.

* * * * *